(12) United States Patent
Moon et al.

(10) Patent No.: US 6,703,069 B1
(45) Date of Patent: Mar. 9, 2004

(54) UNDER BUMP METALLURGY FOR LEAD-TIN BUMP OVER COPPER PAD

(75) Inventors: Peter K. Moon, Portland, OR (US); Zhiyong Ma, Portland, OR (US); Madhav Datta, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/262,281

(22) Filed: Sep. 30, 2002

(51) Int. Cl.[7] .................. H01L 21/44; H01L 23/532; B05D 3/00
(52) U.S. Cl. .................. 427/123; 438/688; 438/761; 438/613; 257/737; 257/781; 427/304
(58) Field of Search .................. 174/126.1; 257/737, 257/738, 758, 772, 779, 781, 773; 438/612, 613, 617, 688, 761; 439/55; 427/123, 304, 375

(56) References Cited

U.S. PATENT DOCUMENTS

| | | | | |
|---|---|---|---|---|
| 5,975,408 A | * | 11/1999 | Goossen | 228/173.2 |
| 6,153,503 A | * | 11/2000 | Lin et al. | 438/613 |
| 2002/0190395 A1 | * | 12/2002 | Fang et al. | 257/784 |
| 2003/0073300 A1 | * | 4/2003 | Chen et al. | 438/613 |

\* cited by examiner

Primary Examiner—Michael LaVilla
(74) Attorney, Agent, or Firm—George Chen

(57) ABSTRACT

The present invention describes a method including providing a component, the component having a bond pad; forming a passivation layer over the component; forming a via in the passivation layer to uncover the bond pad; and forming an under bump metallurgy (UBM) over the passivation layer, in the via, and over the bond pad, in which the UBM includes an alloy of Aluminum and Magnesium.

The present invention also describes an under bump metallurgy (UBM) that includes a lower layer, the lower layer including an alloy of Aluminum and Magnesium; and an upper layer located over the lower layer.

6 Claims, 1 Drawing Sheet

UNDER BUMP METALLURGY FOR LEAD-TIN BUMP OVER COPPER PAD

BACKGROUND OF THE INVENTION

1. Field of the Invention

The present invention relates to the field of semiconductor integrated circuit (IC) manufacturing, and more specifically, to a method of forming a more reliable under bump metallurgy (UBM) and an UBM that is more reliable.

2. Discussion of Related Art

Chip-to-package interconnections have traditionally involved wirebonding which is very cost-effective. Wirebonding is the use of very fine metal wires to join contacts on a chip with corresponding contacts on a package. As the size of a transistor is reduced, the size of the chip-to-package interconnection also has to be scaled down. However, the performance and the reliability of the chip-to-package interconnection may be affected since wirebonding requires the routing of all the input/output (I/O) connections to the edges of the chip.

Solder bumping is the use of reflowable solder balls to join contacts on the chip with corresponding contacts on the package. Solder bumping requires that the chip be flipped over to face the package. Solder bumping permits I/O connections to be placed across the surface of the chip, which results in many advantages. First, bumping significantly increases the density of the I/O connections. Second, bumping simplifies the design and layout of the chip. Third, bumping decreases the footprint of the package. Fourth, bumping greatly enhances the reliability of the I/O connections.

Transistors on the chip have traditionally been connected with Aluminum lines. As the size of the transistor continued to be reduced, Copper was introduced as a replacement for Aluminum. Copper has lower resistivity than Aluminum so performance of the chip is improved. Copper is more resistant to electromigration than Aluminum so reliability of the chip is also improved.

The bump attached to the bond pad of the chip has traditionally been formed with a Lead-Tin Solder. However, during thermal cycling, the Tin in the bump tends to migrate through cracks or other defects in the UBM and react with the Copper in the bond pad to form an intermetallic compound which may cause shorting of the interconnects thereby leading to premature failure of the interconnect.

Thus, what is needed is a method of forming a more reliable under bump metallurgy (UBM) and an UBM that is more reliable.

BRIEF DESCRIPTION OF THE DRAWINGS

FIG. 1E is also an illustration of an elevation view of a more reliable UBM, according to an embodiment of the present invention.

DETAILED DESCRIPTION OF THE PRESENT INVENTION

In the following description, numerous particular details, such as specific materials, dimensions, and processes, are set forth in order to provide a thorough understanding of the present invention. However, one skilled in the art will realize that the invention may be practiced without these particular details. In other instances, well-known semiconductor equipment and processes have not been described in particular detail so as to avoid obscuring the present invention.

The present invention includes a method of forming a more reliable under bump metallurgy (UBM) and a UBM that is more reliable. The method of the present invention suppresses the diffusion of Tin from a solder bump to an underlying Copper bond pad, minimizes the formation of a Copper-Tin (Cu:Sn) intermetallic compound, and prevents shorting of interconnects. The UBM of the present invention may include Aluminum with an alloying element such as Magnesium.

An embodiment of a method of the present invention is shown in FIGS. 1A–1E. A component 100 may include a substrate 105, in which a device, such as a transistor, has been formed from a semiconducting material, such as Silicon, an insulating material, such as Silicon Oxide and Silicon Nitride, and a conducting material, such as doped Polysilicon and Copper.

The transistor in the substrate 105 may include interconnects that have been formed from multiple layers of conducting lines which are isolated by insulating material. The conducting lines on the different layers may be connected by conducting plugs in vias formed through the insulating material. The conducting lines and plugs may be formed from the same or different materials, such as Copper metal or alloy. The insulating material may be an interlayer dielectric (ILD) formed from Silicon Oxide or a low dielectric constant material, such as a porous Carbon-doped Oxide (CDO or SiOC).

A landing pad, or bond pad 110, may be formed over the substrate 105 to provide access to the interconnects of the underlying device. The bond pad 110 may permit Input/Output (I/O) of an electrical signal, power, or ground, to and from the underlying device, such as the transistor, through the interconnects. The bond pad 110 may be formed from Copper metal or alloy.

Figure 1A:
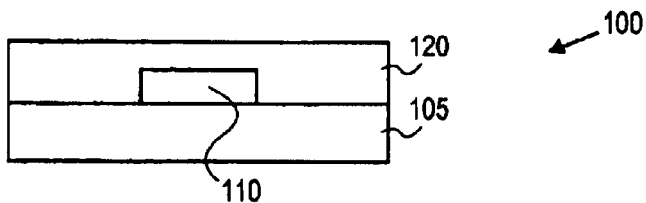
FIGS. 1A–1E are illustrations of an elevation view of an embodiment of a method of forming a more reliable under bump metallurgy (UBM) according to the present invention.
Figure 1B:
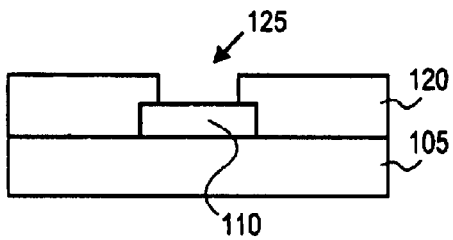
Figure 1C:
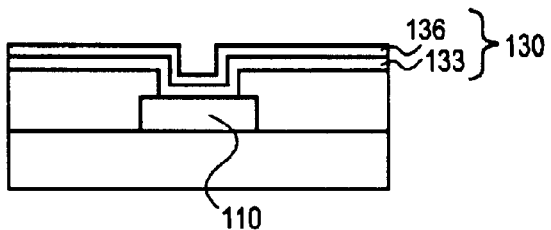

As shown in an embodiment of the present invention in FIG. 1A, a passivation layer 120 may be formed over the substrate 105 to keep out contaminants and moisture and prevent corrosion or other damage to the interconnects and the underlying device. The passivation layer 120 may also serve as a planarizing layer to assist in subsequent processing, especially photolithography. The passivation layer 120 may further serve as a stress buffer layer. The characteristics that are desired for the passivation layer 120 include good adhesion, good thermal stability, high tensile strength, and good chemical resistance.

The passivation layer 120 may include Silicon Oxide, Silicon Nitride, and an organic material, such as a polyimide. In one embodiment, the polyimide may be covered with a radiation-sensitive material, such as a photoresist, and patterned with photolithography. In another embodiment, a photodefinable polyimide, may be spin-coated directly over the bond pad 110 and the substrate 105. The photodefinable polyimide may be exposed to radiation of the appropriate wavelength, energy, and dose, as modulated by a mask with a bump pattern. Developing of the photodefinable polyimide followed by etching to uncover the bond pad 110 will form a via 125 over the bond pad 110, as shown in an embodiment of the present invention in FIG. 1B.

In order to prevent high contact resistance, a plasma pre-clean, or ashing, may be performed to remove any Oxide that may be present on the bond pad 110. Then, an UBM 130 may be formed over the passivation layer 120, in the via 125, and over the bond pad 110, as shown in an embodiment of the present invention in FIG. 1C.

The UBM 130 provides a reliable electrical and mechanical interface between the underlying bond pad 110 and the overlying bump 155. In an embodiment of the present invention, the UBM 130 may include a multilayer stack of materials.

In one embodiment of the present invention, the UBM 130 may include an upper layer 136 located over a lower layer 133. In an embodiment of the present invention, the upper layer 136 of the UBM 130 may be formed from a Nickel-Vanadium (NiV) alloy which is wettable by the solder 150. A material that is wettable by the solder 150 will dissolve in the solder 150 to strengthen the metallurgical bond. In an embodiment of the present invention, the upper layer 136 of a NiV alloy may have a thickness of about 50–1,000 nm.

In another embodiment of the present invention, the lower layer 133 of the UBM 130 may be formed from a stack of materials, including an Aluminum alloy that is sandwiched between a top Titanium and a bottom Titanium. The top Titanium improves adhesion between the upper layer 136 and the lower layer 133 of the UBM 130. The top Titanium also suppresses diffusion of Nickel (Ni) from the upper layer 136. In an embodiment of the present invention, the top Titanium may have a thickness of about 20–500 nanometers (nm).

The Aluminum alloy in the stack may include Aluminum and one or more suitable alloying elements. An alloy is a solid solution of two or more metals. A suitable alloying element will suppress the diffusion of Tin from the overlying bump 155. In an embodiment, the suitable alloying element may be about 0.5–2.5% Magnesium by weight. In other embodiments of the present invention, the suitable alloying element may include Chromium (Cr), Germanium (Ge), Hafnium (Hf), Lithium (Li), Manganese (Mn), Palladium (Pd), Vanadium (V), and Zirconium (Zr). In general, Titanium (Ti) and Silicon (Si) are not suitable alloying elements for the Aluminum. In one embodiment of the present invention, the Aluminum alloy may have a uniform composition through its thickness. In another embodiment of the present invention, the Aluminum alloy may have a graded composition through its thickness. In one embodiment of the present invention, the Aluminum alloy may have a thickness of about 100–1,000 nm. In another embodiment of the present invention, the Aluminum alloy may have a thickness of about 100–400 nm.

In one embodiment of the present invention, the Aluminum alloy suppresses diffusion of Tin (Sn) from the overlying bump 155. In another embodiment of the present invention, the Aluminum alloy suppresses diffusion of Copper (Cu) from the underlying bond pad 110. The formation and growth of Copper-Tin (Cu:Sn) intermetallic compounds is controlled and limited to prevent shorting of interconnects.

The bottom Titanium improves adhesion between the lower layer 133 of the UBM 130 and the underlying bond pad 110. Titanium decreases interfacial contact resistance to the bond pad 110 by chemically reducing any oxide that may be present on the bond pad 110. The edges of the via 125 formed through the passivation layer 120 should be hermetically sealed by the UBM 130 to prevent corrosion of the interconnects that are located below the bond pad 110. Titanium also increases resistance to electromigration. In an embodiment, the bottom Titanium may have a thickness of about 20–500 nm.

The UBM 130 may be formed as a blanket film by physical vapor deposition (PVD) or sputtering. In one embodiment of the present invention, the UBM may be formed by ionized PVD (I-PVD) to achieve good conformality in filling a via 125 having a high aspect ratio.

If two or more layers are being sputtered sequentially for the UBM 130, a different target may be used for each layer. The sequential sputtering may be done without breaking vacuum so as to reduce contamination, prevent formation of Oxides, and improve throughput.

If two or more materials, such as Aluminum and Magnesium, are to be co-sputtered for a layer in the UBM 130, a particular composition of the sputtering target may be specified in order to produce the desired composition in the layer of the UBM 130 being formed. The difference in composition between the target and the layer may be caused by a difference in sputtering efficiency or sticking coefficient.

In another embodiment of the present invention, the composition of a layer that has been sputtered may be modified by annealing. The annealing may be performed in a gas. The gas may be inert or reactive.

Next, the UBM 130 may be covered with a layer of photoresist 140. After aligning the component 100 with respect to a mask, the photoresist 140 may be exposed with the appropriate radiation. After developing the photoresist 140, an opening 145 is formed in the photoresist 140 over the upper layer 136 of the UBM 130, as shown in an embodiment in FIG. 1D. In one embodiment, the opening 145 in the photoresist 140 may be located over the bond pad 110. In another embodiment, the opening 145 may be offset to one side of the bond pad 110.

An electroplating cell includes two electrodes that are immersed in an electrolyte and connected through an external circuit to a power supply. A consumable anode in the electroplating cell may include an alloy of the metals which form the solder 150. In one embodiment, the solder 150 may be a high Lead solder, having a composition of 95% Lead (Pb) and 5% Tin (Sn), by weight. The external circuit may remove electrons from the anode to oxidize the metals and release positively-charged metal ions into the electrolyte.

The UBM 130 may serve as a cathode in the electroplating cell. The UBM 130 provides a low-resistance electrical path for the external circuit to supply electrons to reduce the positively-charged metal ions in the electrolyte and electroplate the metals, through the opening 145 in the photoresist 140, over the upper layer 136 of the UBM 130.

Figure 1D:
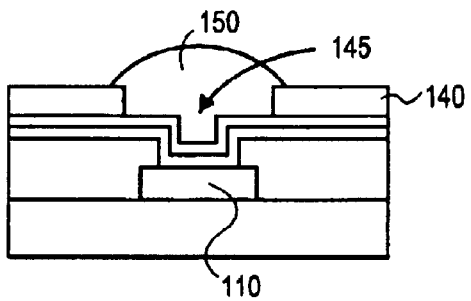

The solder 150 will spread out in a mushroom shape once the thickness of the solder 150 being electroplated in the opening 145 of the photoresist 140 exceeds the thickness of the photoresist 140, as shown in an embodiment of the present invention in FIG. 1D.

In another embodiment of the present invention, a very thick layer of photoresist 140 is used so the thickness of the solder 150 being electroplated in the opening 145 of the photoresist 140 does not exceed the thickness of the photoresist 140. As a result, the solder 150 retains a pillar shape within the opening 145 in the photoresist 140.

After the solder 150 has been electroplated into mushroom-shaped, or pillar-shaped, islands on the component 100, the photoresist 140 is stripped off.

In order to prevent shorting of the islands of electroplated solder 150, a wet etch solution, that will not etch the solder 150, may be used, in one embodiment of the present invention, to etch away the exposed portion of the UBM 130 that is not covered by the solder 150. Etching around the edges of the covered portion of the UBM 130 located beneath the islands of solder 150 should be controlled so any undercut is minimized, such as to 2 microns (um) or less.

After etching away the exposed portion of the UBM 130, the islands of solder 150 may be reflowed. The melting (liquidus) temperature of the solder 150 depends on the alloy composition of the solder 150. A high Lead solder, such as 95 Pb/5 Sn by weight percent, may flow at about 308 degrees Centigrade.

A convection oven may be used to reflow the solder 150. Forming gas may be used as a cover gas in the convection oven. Forming gas may have a passive component, such as 90% Nitrogen to prevent formation of Oxides, and an active component, such as 10% Hydrogen to chemically reduce existing Oxides.

Figure 1E:
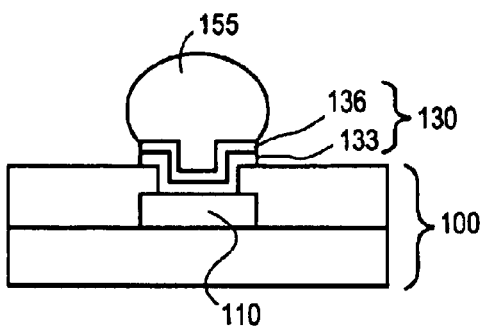

Upon cooling, surface tension will draw each island of solder 150 into a bump 155 having an approximately spherical shape, as shown in an embodiment of the present invention in FIG. 1E. The minimum distance between the centers of adjacent islands of solder 150, or bump pitch, is limited by assembly and reliability considerations and may be selected from a range of about 50–300 um.

After solidification, the bump 155 may have a diameter selected from a range of about 20–150 um. The diameter and height of the bump 155 depends on the area of the wettable metal base, which is determined by the undercut of the UBM 130. The thickness, or bump 155 height, should be well-controlled, with a standard deviation of less than 2.5 um within the component 100 and across a batch of components 100.

The bump 155 height will affect the standoff height when the component 100 is later attached to a substrate in a package. The uniformity of bump 155 height across the component 100 will also affect the coplanarity of the bumps 155 across the component 100. Coplanarity, in turn, determines how reliably all of the bumps 155 on the component 100 may be subsequently connected to the pads on the substrate in the package.

FIG. 1E also shows a more reliable UBM 130, according to an embodiment of the present invention. In one embodiment of the present invention, the UBM 130 may include a multilayer stack of materials, such as a lower layer 133 and an upper layer 136.

In one embodiment of the present invention, the lower layer 133 of the UBM 130 may include an Aluminum alloy. The Aluminum alloy may include one or more suitable alloying elements, such as Magnesium. The suitable alloying elements suppress the diffusion of metals, such as Tin (Sn), from the overlying bump 155. In an embodiment of the present invention, the Aluminum alloy may include about 0.5–2.5% by weight of Magnesium. In one embodiment of the present invention, the Aluminum alloy may have a uniform composition through its thickness. In another embodiment of the present invention, the Aluminum alloy may have a graded composition through its thickness. In one embodiment of the present invention, the Aluminum alloy may have a thickness of about 100–1,000 nm. In another embodiment of the present invention, the Aluminum alloy may have a thickness of about 100–400 nm.

In another embodiment of the present invention, the lower layer 133 of the UBM 130 may include a stack of Titanium/Aluminum alloy/Titanium. The Titanium underlying the Aluminum alloy may have a thickness of about 20–500 nm. The Titanium overlying the Aluminum alloy may have a thickness of about 20–500 nm.

The upper layer 136 of the UBM 130 may include a Nickel-Vanadium (NiV) alloy. The NiV alloy may have a thickness of about 50–1,000 nm.

Many alternative embodiments and numerous particular details have been set forth above in order to provide a thorough understanding of the present invention. One skilled in the art will appreciate that many of the features in one embodiment are equally applicable to other embodiments. One skilled in the art will also appreciate the ability to make various equivalent substitutions for those specific materials, processes, dimensions, concentrations, etc. described herein. It is to be understood that the detailed description of the present invention should be taken as illustrative and not limiting, wherein the scope of the present invention should be determined by the claims that follow.

Thus, we have described a method of forming a more reliable under bump metallurgy (UBM) and an UBM that is more reliable.

We claim:

1. A method comprising:

providing a component, said component having a bond pad;

forming a passivation layer over said component;

forming a via in said passivation layer to uncover said bond pad; and forming an under bump metallurgy (UBM) over said passivation layer, in said via, and over said bond pad, said UBM comprising an alloy of Aluminum and Magnesium.

2. The method of claim 1 further comprising:

forming a photoresist over said UBM;

forming an opening in said photoresist to uncover said UBM over said bond pad;

forming a solder over said opening;

removing said photoresist;

removing an exposed portion of said UBM that is not covered by said solder; and reflowing said solder into a bump.

3. The method of claim 1 wherein said alloy in said UBM comprises about 0.5–2.5% by weight of Magnesium.

4. The method of claim 1 wherein said alloy in said UBM is formed by co-sputtering said Aluminum and said Magnesium.

5. The method of claim 1 wherein said UBM further comprises a bottom Titanium underlying said alloy.

6. The method of claim 1 wherein said UBM further comprises a top Titanium overlying said alloy.

\* \* \* \* \*